United States Patent
Yun et al.

(10) Patent No.: US 10,582,609 B2
(45) Date of Patent: Mar. 3, 2020

(54) INTEGRATION OF THROUGH GLASS VIA (TGV) FILTER AND ACOUSTIC FILTER

(71) Applicant: QUALCOMM Incorporated, San Diego, CA (US)

(72) Inventors: Changhan Hobie Yun, San Diego, CA (US); Jonghae Kim, San Diego, CA (US); Xiaoju Yu, San Diego, CA (US); Mario Francisco Velez, San Diego, CA (US); Wei-Chuan Chen, San Diego, CA (US); Niranjan Sunil Mudakatte, San Diego, CA (US); Matthew Michael Nowak, San Diego, CA (US); Christian Hoffmann, Munich (DE); Rodrigo Pacher Fernandes, Deutschlandsberg (AT); Manuel Hofer, Deutschlandsberg (AT); Peter Bainschab, Deutschlandsberg (AT); Edgar Schmidhammer, Munich (DE); Stefan Leopold Hatzl, Deutschlandsberg (AT)

(73) Assignee: QUALCOMM Incorporated, San Diego, CA (US)

( * ) Notice: Subject to any disclaimer, the term of this patent is extended or adjusted under 35 U.S.C. 154(b) by 155 days.

(21) Appl. No.: 15/798,071

(22) Filed: Oct. 30, 2017

(65) Prior Publication Data
US 2019/0132942 A1    May 2, 2019

(51) Int. Cl.
*H05K 1/02* (2006.01)
*H05K 3/32* (2006.01)
(Continued)

(52) U.S. Cl.
CPC ............. *H05K 1/0233* (2013.01); *H03H 3/02* (2013.01); *H03H 3/08* (2013.01);
(Continued)

(58) Field of Classification Search
CPC .......... H05K 1/0233; H05K 3/32; H03H 3/02; H03H 3/08; H03H 9/02086; H03H 9/0547; H03H 9/1014; H03H 9/1071
(Continued)

(56) References Cited

U.S. PATENT DOCUMENTS

| 7,508,286 B2 | 3/2009 | Ruby et al. |
| 9,397,151 B1 | 7/2016 | Astrof et al. |

(Continued)

FOREIGN PATENT DOCUMENTS

WO    2017115731 A1    7/2017

OTHER PUBLICATIONS

Kim et al., "High-Q 3D RF Solenoid Inductors in Glass", 2014 IEEE Radio Frequency Integrated Circuits Symposium, pp. 199-200 (Year: 2014).*

(Continued)

*Primary Examiner* — Benny T Lee
*Assistant Examiner* — Hafizur Rahman
(74) *Attorney, Agent, or Firm* — Qualcomm Incorporated/Seyfarth Shaw LLP (57) ABSTRACT

A passive on glass (POG) on filter capping apparatus may include an acoustic filter die. The apparatus may further include a capping die electrically coupled to the acoustic filter die. The capping die may include a 3D inductor.

19 Claims, 9 Drawing Sheets

(51) Int. Cl.
 H03H 9/02 (2006.01)
 H03H 9/10 (2006.01)
 H03H 3/02 (2006.01)
 H03H 9/05 (2006.01)
 H03H 3/08 (2006.01)
(52) U.S. Cl.
 CPC ...... *H03H 9/02086* (2013.01); *H03H 9/0547* (2013.01); *H03H 9/1014* (2013.01); *H03H 9/1071* (2013.01); *H05K 3/32* (2013.01)
(58) Field of Classification Search
 USPC .......................................................... 333/12
 See application file for complete search history.

(56) References Cited

U.S. PATENT DOCUMENTS

| | | | |
|---|---|---|---|
| 2004/0029356 A1* | 2/2004 | Timme | H03H 3/02 438/455 |
| 2006/0290457 A1 | 12/2006 | Lee et al. | |
| 2007/0085648 A1 | 4/2007 | Lee et al. | |
| 2011/0090651 A1 | 4/2011 | Jung et al. | |
| 2013/0207745 A1 | 8/2013 | Yun et al. | |
| 2014/0035702 A1 | 2/2014 | Black et al. | |
| 2014/0035935 A1* | 2/2014 | Shenoy | H01L 23/15 345/501 |
| 2014/0354114 A1 | 12/2014 | Moriya et al. | |
| 2017/0187345 A1 | 6/2017 | Yun et al. | |
| 2017/0250669 A1 | 8/2017 | Kuroyanagi et al. | |

OTHER PUBLICATIONS

Lai et al., "300mm Size Ultra-thin Glass Interposer Technology and High-Q Embedded Helical Inductor (EHI) for Mobile Application" 2013 IEEE International Electron Devices Meeting, Washington, DC, USA, Dec. 9-11, 2013, pp. 357-360. (Year: 2013).*
Woehrmann et al., "Glass based interposers for RF applications up to 100GHz", 2016 6th Electronic System-Integration Technology Conference (ESTC), Sep. 13-15, 2016 (Year: 2016).*
Lee, "What's What in Advanced Packaging" in Solid state Technology magazine, Nov. 2017, pp. 1, 3, Fig. 5. (Year: 2017).*
"Bonding Methods", published on the Quattrone Nano-Fabrication Facility of University of Pennsylvania site on Oct. 2014. (Year : 2014).*
"Pyrex Glass", Science Direct, published by Elsevier in 2018, 1st paragraph of p. 21 (Year: 2018).*
Bae H.C., et al., "Cost-Effective and High-Performance FBAR Duplexer Module with Wafer Level Packaging", Microwave Conference Proceedings (APMC), 2011 Asiapacific, IEEE, Dec. 5, 2011 (Dec. 5, 2011), XP032152826, pp. 1074-1077.
International Search Report and Written Opinion—PCT/US2018/051943—ISA/EPO—dated Jan. 22, 2019.

* cited by examiner

INTEGRATION OF THROUGH GLASS VIA (TGV) FILTER AND ACOUSTIC FILTER

TECHNICAL FIELD

The present disclosure generally relates to integrated circuits (ICs). More specifically, the present disclosure relates to integration of a through glass via (TGV) filter and an acoustic filter.

BACKGROUND

One goal driving the wireless communication industry is providing consumers with increased bandwidth. The use of carrier aggregation in current generation communications provides one possible solution for achieving this goal. Carrier aggregation enables a wireless carrier to increase bandwidth by simultaneously using multiple frequencies for a single communication stream. While an increased amount of data is provided to the end user, carrier aggregation implementation is complicated by noise created at the harmonic frequencies due to the frequencies used for data transmission. For example, 700 MHz transmissions may create harmonics at 2.1 GHz, which interfere with data broadcast at 2 GHz frequencies.

The design complexity of mobile radio frequency (RF) chips (e.g., mobile RF transceivers) is complicated by added circuit functions for supporting communication enhancements, such as carrier aggregation. Designing mobile RF transceivers may include using acoustic filters and resonators for processing signals carried in a carrier aggregation system. Many passive devices may be included in such filters and resonators. Each of these passive devices may include many inductors and capacitors.

Existing die scale surface acoustic wave (SAW) packaging (DSSP2) includes 2D inductors on a capping wafer. These 2D inductors generate a vertical magnetic field on the SAW filter, which interferes with the filter's functionality. There is also not enough space to include many inductors for generating a phase shifter for duplexers or other multiplexers. Additionally, existing process flows for DSSP2 devices are complex for fabricating both 2D inductors and through substrate vias (TSVs) for interconnects.

Fabricating high performance filters and resonators in an efficient and cost-effective manner for supporting communication enhancements is problematic. Increasing the quality (Q) of the inductors used by the filters and resonators is also an issue. Reducing the electromagnetic coupling and interference between the inductors in a device, while also increasing a number of inductors in the device, would be beneficial.

SUMMARY

A passive on glass (POG) on filter capping apparatus may include an acoustic filter die. The apparatus may further include a capping die electrically coupled to the acoustic filter die. The capping die may include a 3D inductor.

A method of fabricating a passive on glass (POG) on filter capping apparatus may include fabricating a plurality of vias in a capping die. The method may further include coupling the plurality of vias together with traces on opposing surfaces of the capping die to form a 3D inductor. The method may further include coupling the capping die to an acoustic filter die.

A passive on glass (POG) on filter capping apparatus may include means for filtering. The apparatus may further include a glass capping die electrically coupled to the means for filtering. The glass capping die may include a 3D inductor.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR", and the use of the term "or" is intended to represent an "exclusive OR." As described herein, the term "exemplary" used throughout this description means "serving as an example, instance, or illustration," and should not necessarily be construed as preferred or advantageous over other exemplary configurations. The term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

As described herein, the term "2D inductor" used throughout this description means "an inductor that is substantially planar in shape having coils limited to a single interconnect layer that do not extend into other interconnect layers." As described herein, the term "3D inductor" used throughout this description means "an inductor having coils in multiple interconnect layers."

Mobile radio frequency (RF) chips (e.g., mobile RF transceivers) have migrated to a deep sub-micron process node due to cost and power consumption considerations. The design complexity of mobile RF transceivers is further complicated by adding circuit functions for supporting communication enhancements, such as 5G technologies. Further design challenges for mobile RF transceivers include analog/RF performance considerations, including mismatch, noise and other performance considerations. Designing these mobile RF transceivers includes using passive devices, for example, for suppressing resonance, and/or for performing filtering, bypassing, and coupling.

Successfully fabricating modern semiconductor chip products involves interplay between the materials and the processes employed. In particular, passive components for modern semiconductor chips is an increasingly challenging part of the process flow. This is particularly true in terms of maintaining a small feature size. The same challenge of maintaining a small feature size also applies to passive on glass (POG) technology. Passive on glass technology enables fabrication of high performance components, such as inductors and capacitors, that are built on a highly insulative substrate having a very low loss.

Passive on glass devices include high performance inductor and capacitor components having a variety of advantages over other technologies (e.g., surface mount technology or multi-layer ceramic chips). These advantages include being more compact in size and having smaller manufacturing variations. Passive on glass devices also support a higher quality (Q)-factor value that meets stringent low insertion loss and low power consumption specifications of future process nodes. Passive devices such as inductors may be implemented as 3D structures when using passive on glass technologies. 3D through substrate inductors or other 3D devices, however, may experience a number of design constraints when implemented as 3D structures using passive on glass technology.

An inductor is an example of an electrical device used to temporarily store energy in a magnetic field within a wire coil according to an inductance value. This inductance value provides a measure of the ratio of voltage to the rate of change of current passing through the inductor. When the current flowing through an inductor changes, energy is temporarily stored in a magnetic field in the coil. In addition to their magnetic field storing capability, inductors are often used in alternating current (AC) electronic equipment, such as radio equipment. For example, the design of mobile RF transceivers includes using inductors with improved inductance density and reduced magnetic loss at high frequency.

Various aspects of the disclosure provide techniques for fabrication of a passive on glass (POG) on filter capping apparatus. The process flow for semiconductor fabrication of the multiplexer structure may include front-end-of-line (FEOL) processes, middle-of-line (MOL) processes, and back-end-of-line (BEOL) processes. It will be understood that the term "layer" includes film and is not to be construed as indicating a vertical or horizontal thickness unless otherwise stated. As described herein, the term "substrate" may refer to a substrate of a diced wafer or may refer to a substrate of a wafer that is not diced. Similarly, the terms chip and die may be used interchangeably.

As described herein, the back-end-of-line interconnect layers may refer to the conductive interconnect layers (e.g., metal one (M1), metal two (M2), metal three (M3), etc.) for electrically coupling to front-end-of-line active devices of an integrated circuit. The back-end-of-line interconnect layers may electrically couple to middle-of-line interconnect layers, for example, connecting M1 to an oxide diffusion (OD) layer of an integrated circuit. A back-end-of-line first via (V2) may connect M2 to M3 or others of the back-end-of-line interconnect layers.

Aspects of the present disclosure describe a passive on glass (POG) on filter capping apparatus. In one configuration, a POG on filter capping apparatus includes an acoustic filter die. A capping die may be electrically coupled to the acoustic filter die. The capping die may include a 3D inductor.

Figure 1:
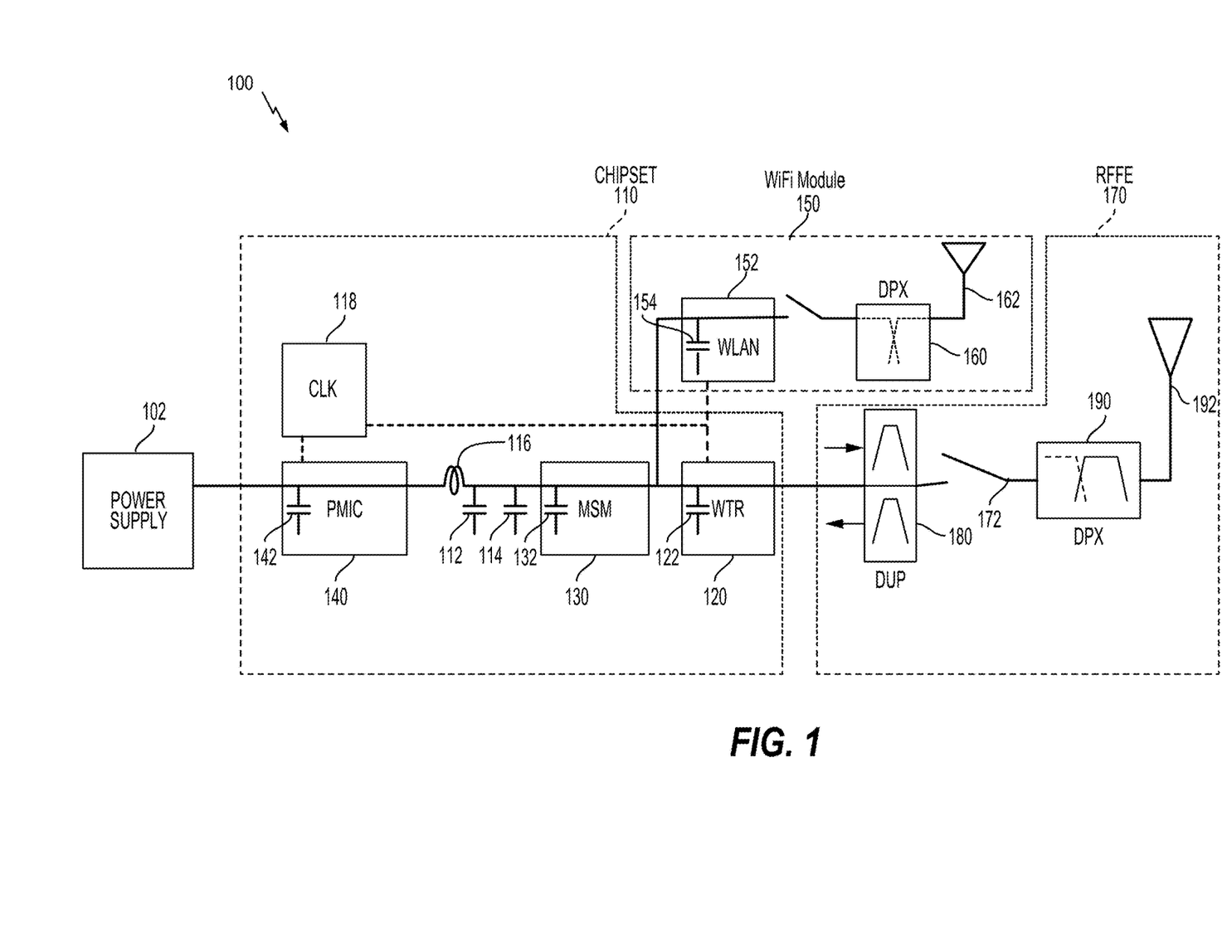
FIG. 1 is a schematic diagram of a radio frequency (RF) front end module and a WiFi module employing diplexers for a chipset to provide carrier aggregation.

FIG. 1 is a schematic diagram of a wireless device 100 (e.g., a cellular phone or a smartphone) including a passive on glass (POG) on filter capping apparatus. The wireless device 100 has a wireless local area network (WLAN) (e.g., WiFi) module 150 and an RF front end module 170 for a chipset 110. The WiFi module 150 includes a first diplexer 160 communicably coupling an antenna 162 to a wireless local area network module (e.g., WLAN module 152). The RF front end module 170 includes the second diplexer 190 communicably coupling an antenna 192 to the wireless transceiver 120 (WTR) through a duplexer 180 (DUP). An RF switch 172 communicably couples the second diplexer 190 to the duplexer 180. The wireless transceiver 120 and the WLAN module 152 of the WiFi module 150 are coupled to a modem (MSM, e.g., a baseband modem) 130 that is powered by a power supply 102 through a power management integrated circuit (PMIC) 140. The chipset 110 also includes capacitors 112 and 114, as well as an inductor(s) 116 to provide signal integrity. The PMIC 140, the modem 130, the wireless transceiver 120, and the WLAN module 152 each include capacitors (e.g., 142, 132, 122, and 154) and operate according to a clock 118. The geometry and arrangement of the various inductor and capacitor components in the chipset 110 may reduce the electromagnetic coupling between the components.

Figure 2A:
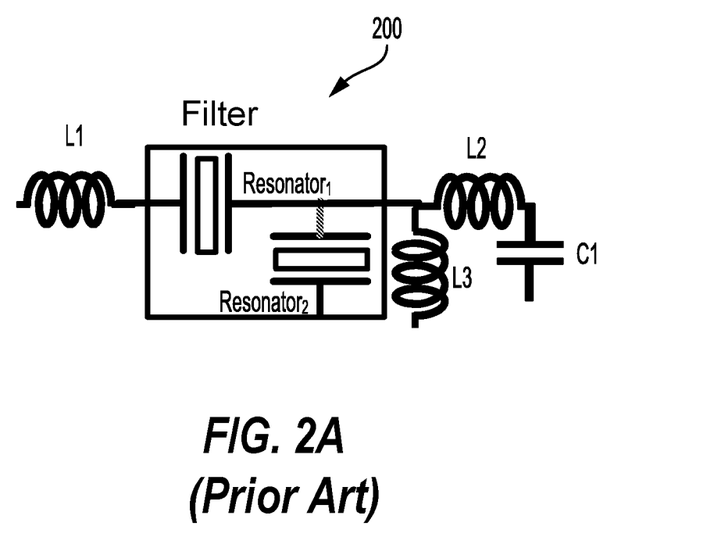
FIG. 2A is a schematic diagram of a conventional filter.

FIG. 2A is a schematic diagram of a conventional filter 200. The conventional filter 200 includes a first resonator (Resonator$_1$) and a second resonator (Resonator$_2$). The second resonator is coupled as a shunt resonator relative to the first resonator. The conventional filter 200 also includes many passive devices such as inductors (e.g., L1, L2, L3)

and capacitors (e.g., C1). In this example, the conventional filter 200 may include at least three inductors (e.g., L1, L2, L3) and one capacitor (e.g., C1). A third inductor L3 may be used for widening a bandwidth of the conventional filter 200. In addition, a second inductor L2 may be used for input/output matching.

Figure 2B:
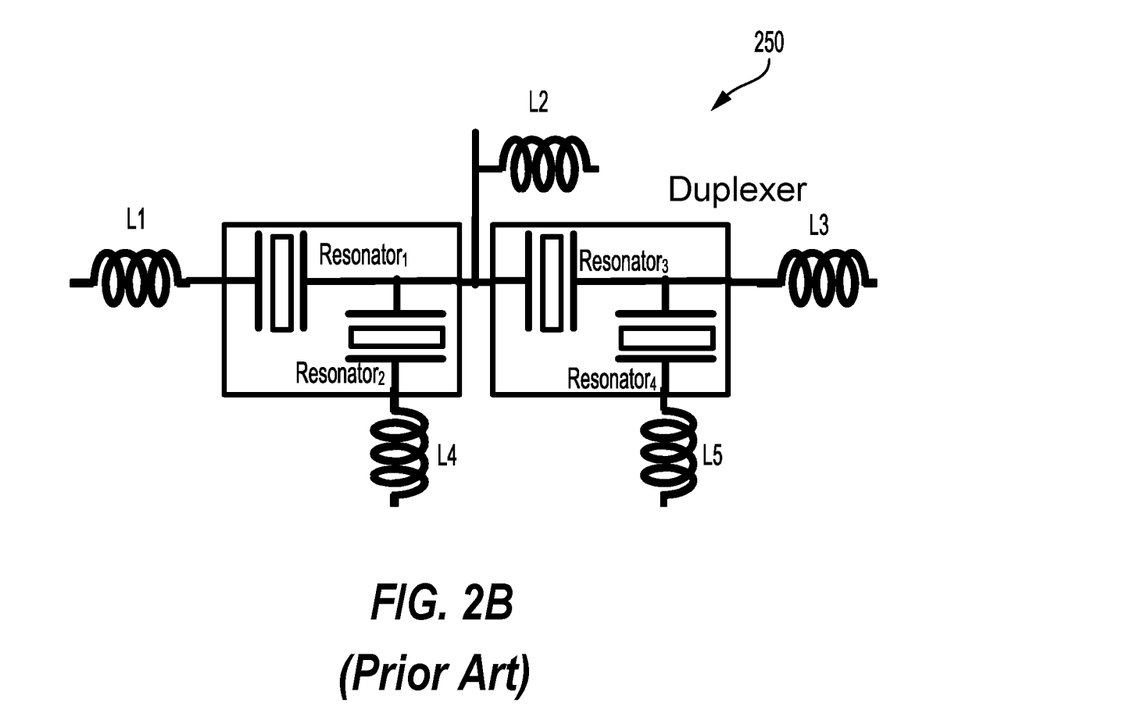
FIG. 2B is a schematic diagram of a conventional duplexer.

FIG. 2B is a schematic diagram of a conventional duplexer 250. The conventional duplexer 250 may be formed by combining two of the conventional filter 200. In this example, the conventional duplexer 250 includes a first resonator (Resonator$_1$) and a second resonator (Resonator$_2$). The second resonator is coupled as a shunt resonator relative to the first resonator. The conventional duplexer 250 also includes a third resonator (Resonator$_3$) and a fourth resonator (Resonator$_4$) in a similar arrangement. The conventional duplexer 250 may include at least five inductors (e.g., L1, L2, L3, L4, L5). A fifth inductor L4 may be coupled to the fourth resonator to add a notch. In addition, a second inductor L2 may provide a phase shift at a common port of the conventional duplexer 250, for example an antenna port.

As shown, the complexity increases as more functionality is desired. For example, implementing a quadplexer (not shown), may include at least 15 inductors.

Figure 3:
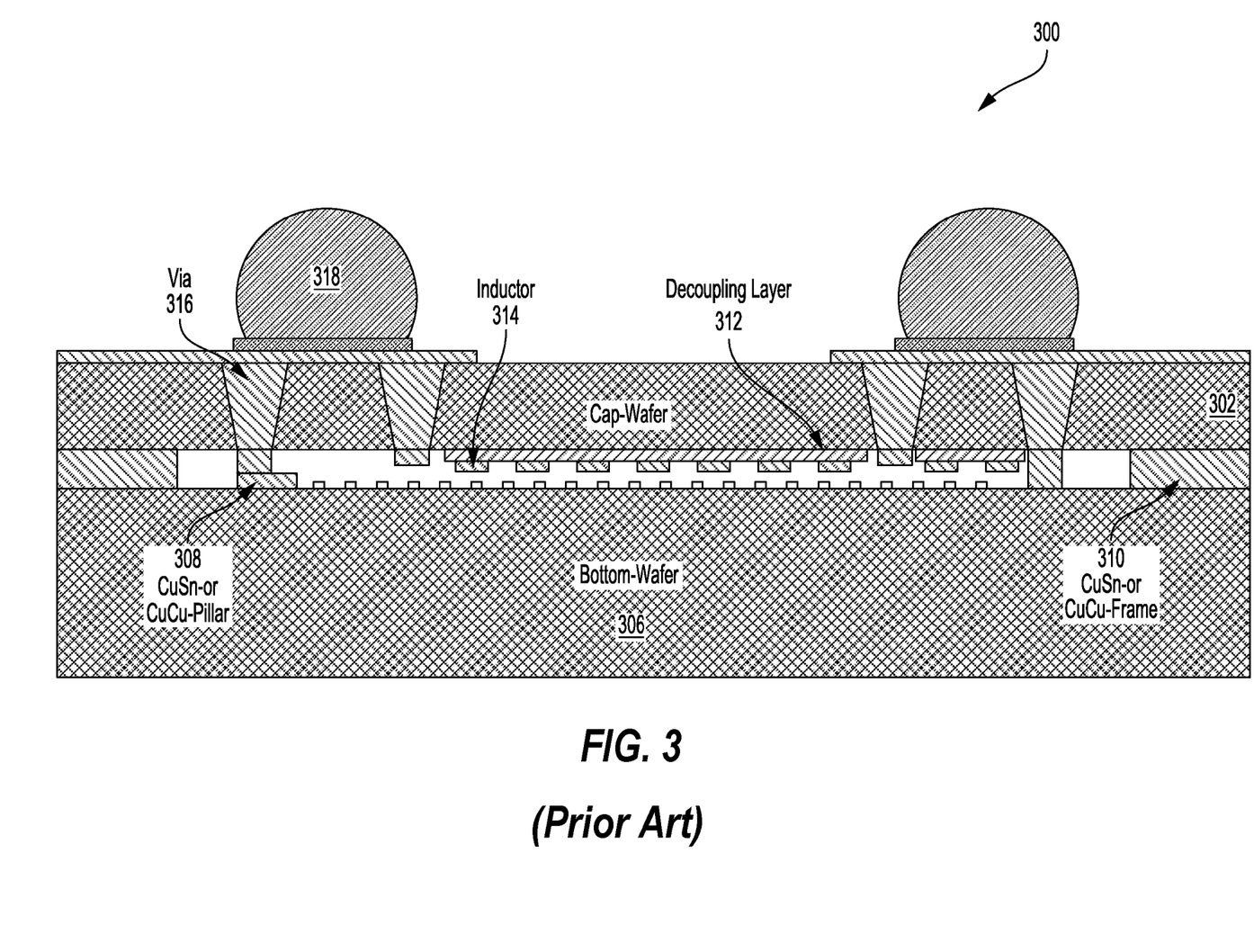
FIG. 3 illustrates a conventional die scale surface acoustic wave (SAW) packaging (DSSP2) device.

FIG. 3 illustrates a conventional die scale surface acoustic wave (SAW) packaging (DSSP2) device 300. The device 300 may include a capping wafer 302 coupled to a bottom wafer 306 through pillars 308 and frames 310. The capping wafer 302 may include a 2D inductor 314 coupled to the capping wafer 302 through a decoupling layer 312. The capping wafer 302 may also include vias 316 for coupling to bumps 318. For example, the 2D inductor 314 is substantially planar in shape having its coils limited to a single interconnect layer, and the coils do not extend into other interconnect layers.

In the depicted configuration of FIG. 3, the device 300 offers limited 2D inductor size/value for integration with the capping wafer 302. For example, there is no space to include multiple inductors (e.g., more than four inductors) in the device 300. This results in insertion loss and limits performance due to low inductor Q, which prevents support for communication enhancements in future RF chips. Controlling inductor coupling and orthogonality for multiple inductors (e.g., more than two inductors) would be difficult. Additionally, no capacitor is included in the capping wafer 302, which prevents full filter functionality in the capping wafer 302.

As FIG. 3 shows, fabricating high performance filters and resonators in an efficient and cost-effective manner for supporting communication enhancements is problematic. Increasing the quality (Q) of the inductors used by the filters and resonators is also an issue due to electromagnetic coupling and interference. Reducing the electromagnetic coupling and interference between the inductors in a device, while also increasing a number of inductors in the device, would be beneficial.

According to aspects of the present disclosure, a passive on glass (POG) on filter capping apparatus addresses the above-described deficiencies. In one configuration, a POG on filter capping apparatus includes an acoustic filter die. A capping die (e.g., a glass die) may be electrically coupled to the acoustic filter die. The capping die may include a 3D inductor.

Figure 4:
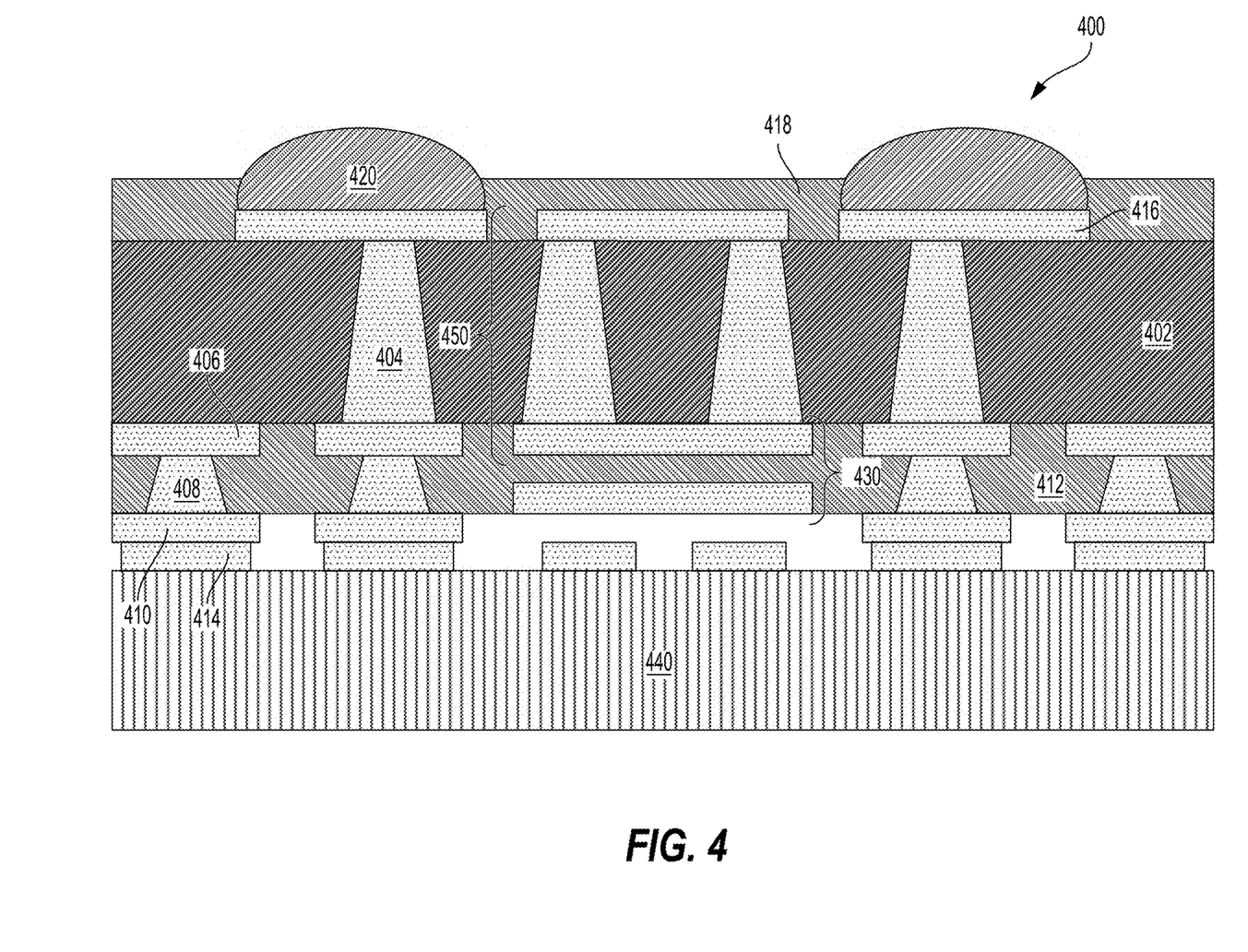
FIG. 4 illustrates a passive on glass (POG) on filter capping apparatus according to aspects of the present disclosure.

FIG. 4 illustrates a passive on glass (POG) on filter capping apparatus 400 according to aspects of the present disclosure. The filter capping apparatus 400 may include a capping die 402 coupled to an acoustic filter die 440. For example, the acoustic filter die 440 may be implemented as a surface acoustic wave (SAW) filter, a bulk acoustic wave (BAW) filter, a film bulk acoustic resonator (FBAR) filter, or other like filter. According to an aspect, the acoustic filter die 440 could be a piezoelectric material, such as lithium niobate (LiNbO$_3$) or lithium tantalate (LiTaO$_3$), and the capping die 402 could be glass. For example, the acoustic filter die 440 may include a combination of silicon (Si) and a thin single crystal layer of lithium niobate (LiNbO$_3$) and/or lithium tantalate (LiTaO$_3$).

The capping die 402 may be coupled to the acoustic filter die 440 through a first metal layer 406, vias 408, a second metal layer 410, and a third metal layer 414. For example, each of the first metal layer 406, the vias 408, the second metal layer 410, and the third metal layer 414 may be copper (Cu) or any other conductive material. Additionally, the first metal layer 406, the vias 408, and the second metal layer 410 may be formed within a first decoupling layer 412 (e.g., a first passivation layer). For example, the first metal layer 406 and the first decoupling layer 412 may be formed on a front-side of the capping die 402. The third metal layer 414 may be formed on a front-side of the acoustic filter die 440. The third metal layer 414 may directly contact the second metal layer 410. The vias 408 may directly couple the second metal layer 410 to the first metal layer 406. The capping die 402 may hermetically or near-hermetically seal the acoustic filter die 440.

According to an aspect of the disclosure, the capping die 402 may include a 3D inductor 450 and a capacitor 430. The 3D inductor 450 may include an inductor having coils in multiple interconnect layers. For example, the 3D inductor 450 may be formed by the first metal layer 406, vias 404, and a fourth metal layer 416, where coils of the 3D inductor 450 are in the first metal layer 406 and the fourth metal layer 416. Specifically, the 3D inductor 450 may include coils on multiple interconnect layers, where each coil is substantially planar in shape, with each coil coupled through vias. For example, the 3D inductors 450 includes coils on the first metal layer 406 and the fourth metal layer 416, which are coupled through vias 404. An inductor having coils wound around a core, for example, may not be considered a 3D inductor because it does not include planar coils on multiple interconnect layers.

The vias 404 may be through glass vias (TGVs). The capacitor 430 may be formed by the first metal layer 406, the first decoupling layer 412, and the second metal layer 410. According to an aspect, the 3D inductor 450 and the capacitor 430 may be coupled to each other through the first metal layer 406. For example, the 3D inductor 450 and the capacitor 430 may directly contact each other through the first metal layer 406.

According to an aspect of the present disclosure, a second decoupling layer 418 (e.g., a second passivation layer) and the fourth metal layer 416 may be formed on a backside of the capping die 402. Bumps 420 (or other types of interconnects) may be formed on the fourth metal layer 416 for coupling the filter capping apparatus 400. For example, the bumps 420 may be copper or another conductive material.

Advantages of the filter capping apparatus 400 includes full filter/diplexer functionality for generating a multiplexer. For example, many inductors (e.g., more than four inductors) may be included on the filter capping apparatus 400 for implementing a multiplexer. Additionally, the filter capping apparatus 400 may be included in any POG or radio frequency micro-electro-mechanical (RF MEMS) products, including acoustic filters, as well as in 5G cellular hybrid (e.g., high frequency, low inductance value) filters.

The duplexer 180 of the RF front end module 170 may be implemented using the filter capping apparatus 400. The wireless transceiver 120 may include one or more of the filters in the filter capping apparatus 400 for filtering communication signals.

FIGS. 5A-5F illustrate a process for fabricating a passive on glass (POG) on filter capping apparatus according to aspects of the present disclosure.

Figure 5A:
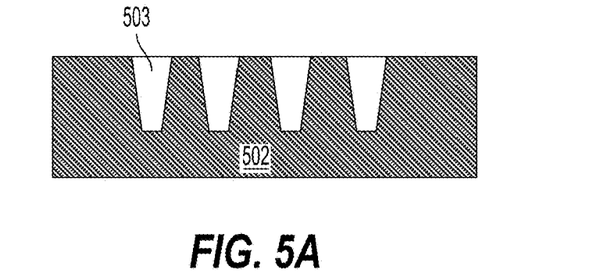
FIGS. 5A-5F illustrate a fabrication process for a passive on glass (POG) on filter capping apparatus according to aspects of the present disclosure.
Figure 5B:
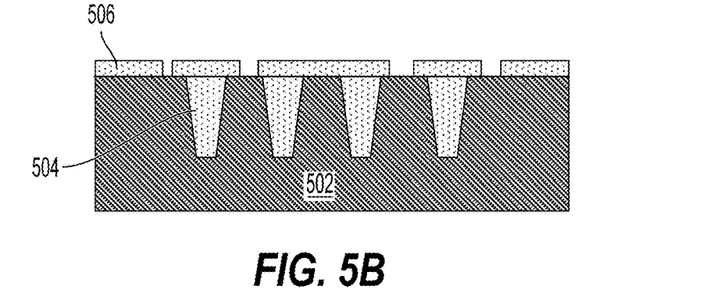

FIG. 5A illustrates multiple trenches 503 formed in a capping die 502 for fabricating vias 504 (FIG. 5B). In this example, the capping die 502 may be glass, or other amorphous material. A thickness of the capping die 502 may be between three-hundred (300) and four-hundred (400) microns. The multiple trenches 503 may be opened through a blind via formation process followed by a copper fill process for forming the vias 504, as shown in FIG. 5B.

FIG. 5B illustrates formation of a first metal layer 506 (e.g., a first redistribution layer (RDL)) over the vias 504 once the multiple trenches 503 are filled using the copper fill process. In this example, the first metal layer 506 and the vias 504 may be composed of copper or other like conductive metal. According to an aspect of the present disclosure, the vias 504 may be through glass vias. The first metal layer 506 may be deposited on a front-side of the capping die 502.

Figure 5C:
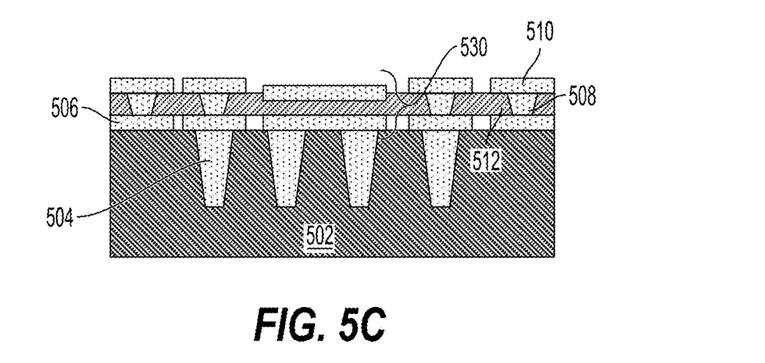

FIG. 5C illustrates deposition and passivation of a first decoupling layer 512 (e.g., a first passivation layer) on the front-side of the capping die 502. Vias 508 and a second metal layer 510 (e.g., a second redistribution layer) may be fabricated in the first decoupling layer 512. A capacitor 530 may be formed by the first metal layer 506, the first decoupling layer 512, and the second metal layer 510. In this example, the capacitor 530 is a metal insulator metal (MIM) capacitor, although other configurations are possible, such as a side by side configuration.

Figure 5D:
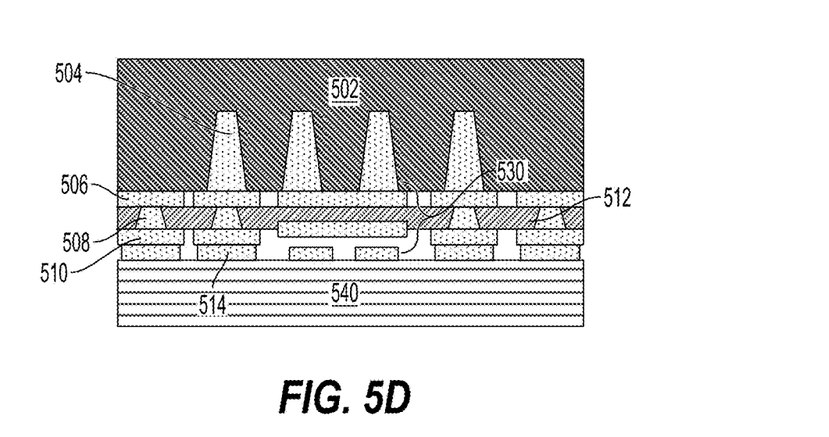

FIG. 5D illustrates metal bonding (e.g., external plating) of the capping die 502 to an acoustic filter die 540. For example, the capping die 502 may include a third metal layer 514 (e.g., a third redistribution layer) on the front-side of the capping die 502. The third metal layer 514 may directly contact the second metal layer 510 to couple the capping die 502 to the acoustic filter die 540. The capping die 502 may hermetically or near-hermetically seal the acoustic filter die 540.

According to aspects, the acoustic filter die 540 may include a surface acoustic wave (SAW) filter, a bulk acoustic wave (BAW) filter, a film bulk acoustic resonator (FBAR) filter, or other like filter. According to an aspect of the present disclosure, the acoustic filter die 540 may be composed of lithium niobate ($LiNbO_3$) or lithium tantalate ($LiTaO_3$).

Figure 5E:
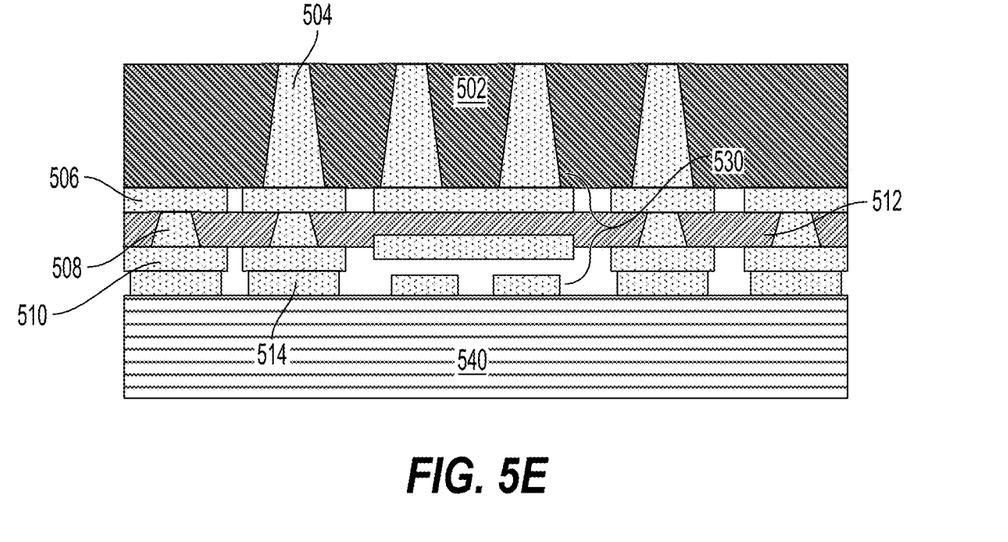

FIG. 5E illustrates a backgrind process to expose the vias 504. This backgrind process reduces the thickness of the capping die 502 to between one-hundred (100) and two-hundred (200) microns. This backgrind process on the capping die 502 reduces the thickness of the capping die 502 until the vias 504 are exposed. In this example, the final thickness of the capping die 502 does not provide sufficient physical support to form through glass vias. Instead, the blind via process of FIG. 5A is performed with the initial thickness of the capping die 502, with the backgrind process completing formation of the vias 504 as through glass vias.

Figure 5F:
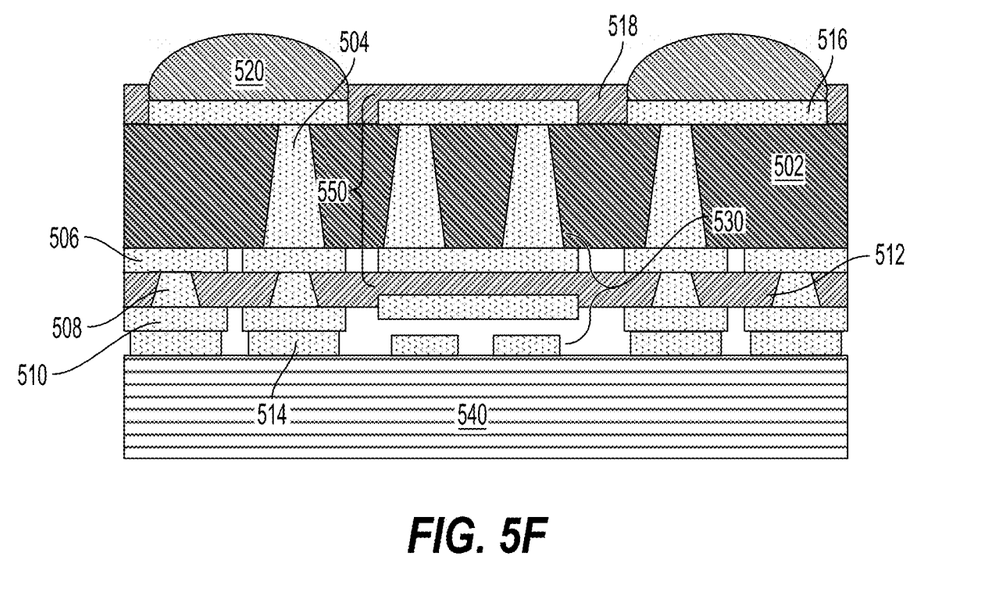

FIG. 5F illustrates formation of a fourth metal layer 516 (e.g., a fourth redistribution layer) and a second decoupling layer 518 (e.g., a second passivation layer) on a backside of the capping die 502. Bumps 520 may be coupled to the fourth metal layer 516. According to an aspect of the present disclosure, a 3D inductor 550 may be formed by the first metal layer 506, the vias 504, and the fourth metal layer 516. The 3D inductor 550 and the capacitor 530 may be coupled to each other through the first metal layer 506. For example, the 3D inductor 550 and the capacitor 530 may directly contact each other through the first metal layer 506.

Figure 6:
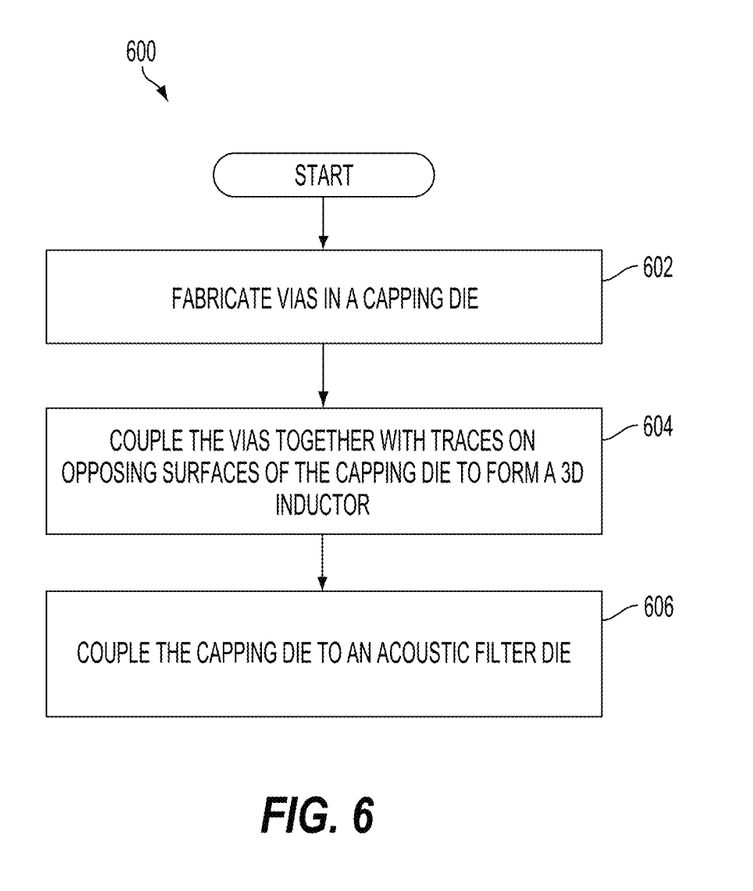
FIG. 6 is a process flow diagram illustrating a method of fabricating a passive on glass (POG) on filter capping apparatus according to aspects of the present disclosure.

FIG. 6 is a process flow diagram illustrating a method 600 of fabricating a passive on glass (POG) on filter capping apparatus according to aspects of the present disclosure. In block 602, vias are fabricated in a capping die. For example, as shown in FIGS. 5A-5B, vias 504 may be fabricated through a blind via formation process followed by a copper fill. According to an aspect, the vias 504 may be TGVs.

In block 604, the vias are coupled together with traces on opposing surfaces of the capping die to form a 3D inductor. For example, as shown in FIG. 5F, the 3D inductor 550 may include the first metal layer 506 on the front-side of the capping die 502, the vias 504, and the fourth metal layer 516 on the backside of the capping die 502.

In block 606, the capping die is coupled to an acoustic filter die. For example, as shown in FIG. 5D, the third metal layer 514 may directly contact the second metal layer 510 to couple the capping die 502 to the acoustic filter die 540. Additionally, as shown in FIG. 5E, the 3D inductor 550 and the capacitor 530 may be coupled to each other through the first metal layer 506.

According to aspects of the present disclosure, the through vias may be fabricated first. This simplifies the fabrication process when compared to a conventional DSSP2 fabrication process, which fabricates the through vias last.

Additionally, a capacitor may be included along with the 3D inductor, thus allowing for full filter functionality on the capping wafer. Consequently, another filter can be built on the SAW/BAW filter. Moreover, the 3D inductor has a lateral magnetic field, causing little interference with the SAW/BAW filter. Finally, the process is relatively inexpensive, as glass is cheaper than semiconductor materials.

According to an aspect of the present disclosure, a passive on glass (POG) on filter capping apparatus is described. In one configuration, the apparatus includes means for filtering. The filtering means may be the acoustic filter die 440, 540, as shown in FIG. 4 and FIGS. 5D-5F. In another aspect, the aforementioned means may be any module or any apparatus or material configured to perform the functions recited by the aforementioned means.

Figure 7:
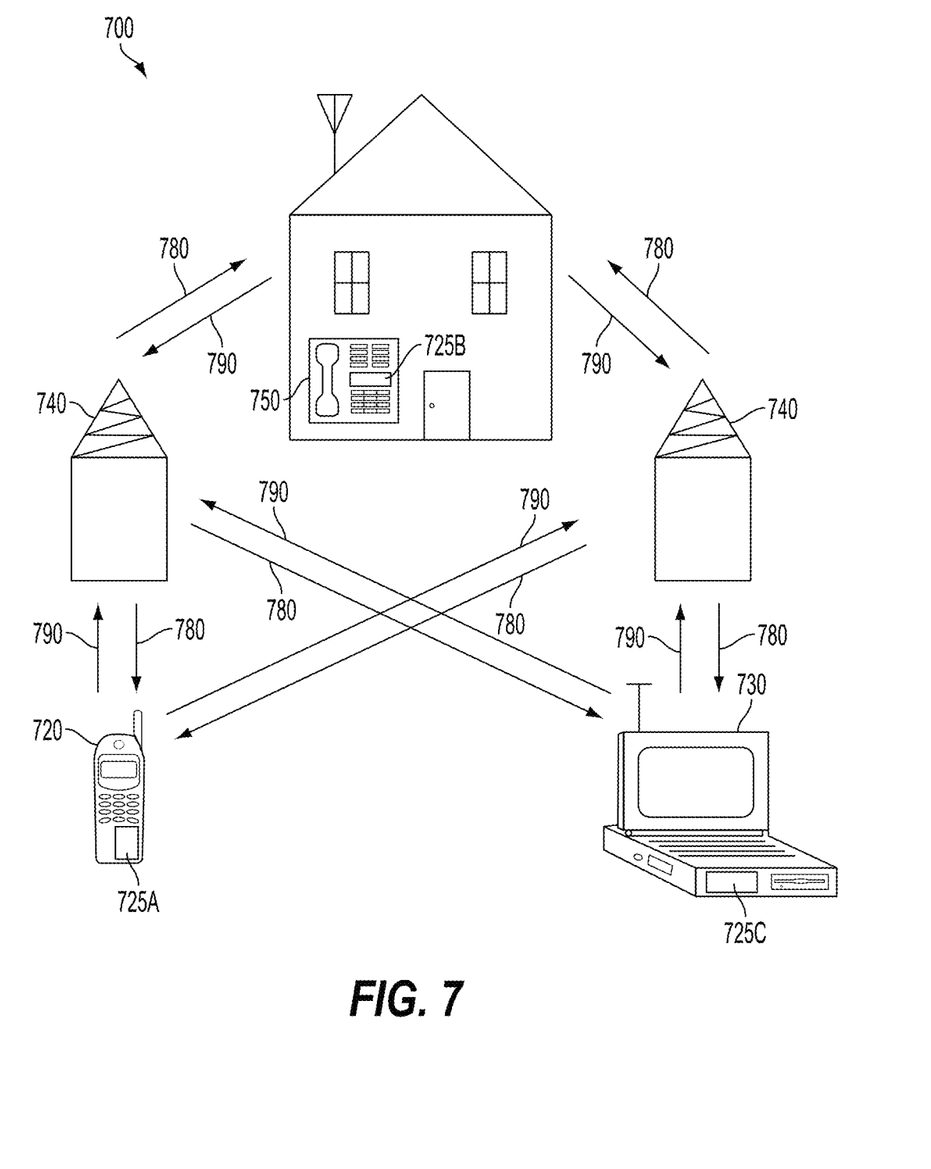
FIG. 7 is a block diagram showing an exemplary wireless communication system in which a configuration of the disclosure may be advantageously employed.

FIG. 7 is a block diagram showing an exemplary wireless communication system 700 in which an aspect of the disclosure may be advantageously employed. For purposes of illustration, FIG. 7 shows three remote units 720, 730, and 750 and two base stations 740. It will be recognized that wireless communication systems may have many more remote units and base stations. Remote units 720, 730, and 750 include IC devices 725A, 725C, and 725B that include the disclosed POG on filter capping apparatus. It will be recognized that other devices may also include the disclosed POG on filter capping apparatus, such as the base stations, switching devices, and network equipment. FIG. 7 shows forward link signals 780 from the base station 740 to the remote units 720, 730, and 750 and reverse link signals 790 from the remote units 720, 730, and 750 to base stations 740.

In FIG. 7, remote unit 720 is shown as a mobile telephone, remote unit 730 is shown as a portable computer, and remote unit 750 is shown as a fixed location remote unit in a wireless local loop system. For example, a remote units may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieve data or computer instructions, or combinations thereof. Although FIG. 7 illustrates remote units according to the aspects of the disclosure, the disclosure is not limited to these exemplary illustrated units. Aspects of the disclosure may be suitably employed in many devices, which include the disclosed POG on filter capping apparatus.

Figure 8:
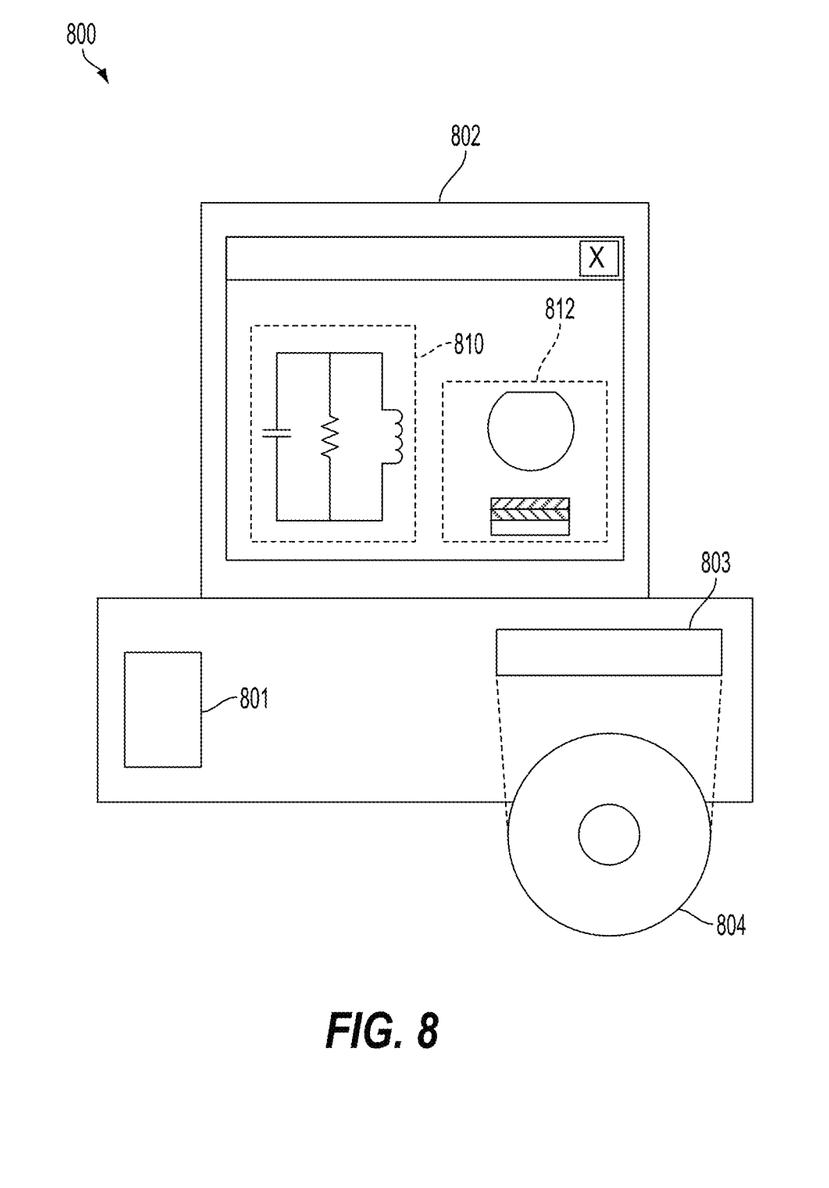
FIG. 8 is a block diagram illustrating a design workstation used for circuit, layout, and logic design of a filter component according to one configuration.

FIG. 8 is a block diagram illustrating a design workstation used for circuit, layout, and logic design of a filter component, such as the POG on filter capping apparatus disclosed above. A design workstation 800 includes a hard disk 801 containing operating system software, support files, and design software such as Cadence or OrCAD. The design workstation 800 also includes a display 802 to facilitate a circuit design 810 or a filter component 812 such as the POG on filter capping apparatus. A storage medium 804 is provided for tangibly storing the circuit design 810 or a filter component 812. The circuit design 810 or the filter component 812 may be stored on the storage medium 804 in a file format such as GDSII or GERBER. The storage medium 804 may be a CD-ROM, DVD, hard disk, flash memory, or other appropriate device. Furthermore, the design workstation 800 includes a drive apparatus 803 for accepting input from or writing output to the storage medium 804.

Data recorded on the storage medium 804 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 804 facilitates the design of the circuit design 810 or the filter component 812 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A passive on glass (POG) on filter capping apparatus, comprising:
    an acoustic filter die;
    a capping die electrically coupled to the acoustic filter die, the capping die including at least a portion of a 3D inductor, and
    a capacitor directly coupled to the 3D inductor though a trace of a plurality of traces that is part of the capacitor and also part of the 3D inductor.

2. The apparatus of claim 1, in which the capping die is arranged to near-hermetically seal the acoustic filter die.

3. The apparatus of claim 1, in which the 3D inductor comprises a plurality of vias coupled together with the plurality of traces on opposing surfaces of the capping die.

4. The apparatus of claim 1, in which the capping die is coupled to the acoustic filter die through a plurality of vias.

5. The apparatus of claim 1, in which the capping die is coupled to the acoustic filter die through external plating.

6. The apparatus of claim 1, in which the capping die comprises an amorphous material.

7. The apparatus of claim 1, integrated into a radio frequency (RF) front end module, the RF front end module incorporated into at least one of a music player, a video player, an entertainment unit, a navigation device, a communications device, a personal digital assistant (PDA), a fixed location data unit, a mobile phone, and a portable computer.

8. The apparatus of claim 1, in which the capacitor and the 3D inductor comprise a filter.

9. A method of fabricating a passive on glass (POG) on filter capping apparatus, comprising:
fabricating a plurality of vias in a capping die;
coupling the plurality of vias together with traces on opposing surfaces of the capping die to form a 3D inductor, one of the traces comprising a plate of a capacitor; and
coupling the capping die to an acoustic filter die.

10. The method of claim 9, further comprising integrating the POG on filter capping apparatus into a radio frequency (RF) front end module, the RF front end module incorporated into at least one of a music player, a video player, an entertainment unit, a navigation device, a communications device, a personal digital assistant (PDA), a fixed location data unit, a mobile phone, and a portable computer.

11. The method of claim 9, in which fabricating the plurality of vias comprises:
opening a plurality of trenches in the capping die with a blind via formation process;
filling the plurality of trenches to form the plurality of vias; and
backgrinding the capping die to expose the plurality of vias.

12. The method of claim 9, in which the coupling comprises depositing conductive traces on the opposing surfaces of the capping die to form the 3D inductor.

13. A passive on glass (POG) on filter capping apparatus, comprising:
Means for filtering;
a glass capping die electrically coupled to the means for filtering, the glass capping die including at least a portion of a 3D inductor, and
a capacitor directly coupled to the 3D inductor though a trace of a plurality of traces that is part of the capacitor and also part of the 3D inductor.

14. The apparatus of claim 13, integrated into a radio frequency front end module, the radio frequency front end module incorporated into at least one of a music player, a video player, an entertainment unit, a navigation device, a communications device, a personal digital assistant (PDA), a fixed location data unit, a mobile phone, and a portable computer.

15. The apparatus of claim 13, in which the glass capping die is arranged to near-hermetically seal the means for filtering.

16. The apparatus of claim 13, in which the 3D inductor comprises a plurality of vias coupled together with the plurality of traces on opposing surfaces of the capping die.

17. The apparatus of claim 13, in which the glass capping die is coupled to the means for filtering through a plurality of vias.

18. The apparatus of claim 13, in which the glass capping die is coupled to the means for filtering through external plating.

19. The apparatus of claim 13, in which the capacitor and the 3D inductor comprise a filter.

* * * * *